US006683818B1

(12) United States Patent
Cornell et al.

(10) Patent No.: US 6,683,818 B1
(45) Date of Patent: Jan. 27, 2004

(54) ASYNCHRONOUS RANDOM ACCESS MEMORY WITH POWER OPTIMIZING CLOCK

(75) Inventors: Charles A. Cornell, Austin, TX (US); Mathew S. Berzins, Austin, TX (US); Steven P. Larky, Del Mar, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 15 days.

(21) Appl. No.: 10/042,783

(22) Filed: Jan. 9, 2002

Related U.S. Application Data (60) Provisional application No. 60/287,660, filed on Apr. 30, 2001.

(51) Int. Cl.[7] ................................................. G11C 7/00
(52) U.S. Cl. ....................... 365/233; 365/206; 365/207; 365/208
(58) Field of Search ................................. 365/233, 206, 365/207, 208

(56) References Cited

U.S. PATENT DOCUMENTS

| | | | | |
|---|---|---|---|---|
| 5,422,858 A | * | 6/1995 | Mizukami et al. ........... | 365/233 |
| 5,563,835 A | * | 10/1996 | Oldham ....................... | 365/207 |
| 5,881,007 A | * | 3/1999 | Jeong et al. ................. | 365/207 |
| 5,940,334 A | * | 8/1999 | Holst .......................... | 365/190 |
| 6,249,482 B1 | * | 6/2001 | Albon et al. ................ | 365/233 |

* cited by examiner

*Primary Examiner*—Son T. Dinh
(74) *Attorney, Agent, or Firm*—Kevin L. Daffer; Conley Rose P.C.

(57) ABSTRACT

A clock may be combined with an asynchronous RAM to create an asynchronous RAM that works within a subset of a full clock period, but allows the address access and other internal RAM functions to occur throughout the clock period. The present invention simplifies the timing analysis of the logic path through the RAM, increases the clock frequency of the resulting logic (compared to a synchronous RAM with narrow timing window), reduces the current requirements (compared to asynchronous RAM), and allows the combinatorial logic to be changed late in the design cycle without the need for a RAM redesign. As more and more logic is synthesized and internal RAM is used to put increasing function on the same die, the structure of the present invention meshes well with synchronous synthesized logic design methodologies, while at the same time recognizes the need to be as stingy as possible with operating current.

20 Claims, 4 Drawing Sheets

ASYNCHRONOUS RANDOM ACCESS MEMORY WITH POWER OPTIMIZING CLOCK

This application claim the benefit of Provisional Application No. 60/287,660 filed Apr. 30, 2001.

BACKGROUND OF THE INVENTION

1. Field of the Invention

This invention relates to semiconductor memory and, more particularly, to clocking an asynchronous random access memory ("RAM") to minimize power consumption. Clocking an asynchronous RAM achieves the speed and flexibility of conventional asynchronous RAM cells, but with reduced power of synchronous RAM cells.

2. Description of the Related Art

The following descriptions and examples are not admitted to be prior art by virtue of their inclusion within this section.

High-speed Random Access Memory devices, or RAM, employ either synchronous or asynchronous control signals, each of which have advantages and disadvantages. Asynchronous RAM apply power to the sense amplifiers during the entire read cycle -during both the access and sense portion of the read cycle. This causes excessive current draw while allowing the address access time to be met at any time during the cycle. Synchronous RAM solves the current problem, but at the expense of a very short access window. Specifically, the full address access time must be met during the rising edge of the synchronizing control clock.

Disadvantages of asynchronous technology are readily apparent in any design where reducing power consumption is necessary. Powering the sense amp during the entire read cycle causes the high current sense amp to be active for a long period. Another disadvantage of using an asynchronous RAM is the need to create a precise write strobe. In order for a series of writes to take place on single-clock-per-write bursts, a write strobe must be created that is less than a single clock period wide. This is normally done by adding some amount of logic to gate the clock with a write control. This logic must then be carefully synthesized, routed, and verified at every stage of the design.

The second alternative is to use a synchronous RAM. That, too, is difficult in most synthesized logic integrated circuits where there is a moderate amount of combinatorial logic both in the address path prior to the RAM cell ("macro") and in the data path after the RAM macro. The synchronous clock would have to be precisely aligned to occur at a time after the address has arrived at the RAM and been decoded, but early enough in order to allow the sense amp to access the data and have that data flow through the logic after the RAM prior to the next bank of flip-flops. Although it is theoretically possible to make the alignment, it is exceedingly difficult to match the alignment of the clock rising edge with the arrival of the address. The address delay will carry as it flows through many levels of logic, and is influenced by a combination of gate delays and routing delays, such that the precise nature of these delays varies considerably over a wide range of fabrication processes. With the routing delay accounting for more than half of the delay, it is not possible to ensure that the delays within the RAM to align the clock will track the address delays across the full process range of fast/slow transistors, high/low sheet resistance, large/small capacitance and variances thereof.

Therefore, it may be desirable to combine the benefits of an asynchronous RAM with the benefits of a synchronous RAM to create a "hybrid" async/sync RAM in the form of a clock enhanced asynchronous RAM. The desired RAM may function during a subset of a full clock period to reduce power consumption, while allowing relaxed setup time requirements to read or write data.

SUMMARY OF THE INVENTION

The problems outlined above are in large part solved by an asynchronous RAM that allows RAM internal logic to precisely gate the clock during write cycles as well as read cycles. The clock is used to enable a write transaction during the second half of the write cycle (when the clock is low). For reads, the clock is used to enable the sense amplifiers only during the second half of the cycle (also when the clock is low). A separate write-enable (WE) signal is used in order to distinguish between read and write during the first half of the cycle (when the clock is high). A standard chip select is used to enable the function of the RAM. Optionally, a latch is added to the output stage of the RAM to capture the data during the read cycle in cases where additional hold time (beyond the end of the clock low period) is desired.

The address decoding occurs during the first half of the clock cycle and the sense amplifiers are enabled during the second half. The flexibility of the read access is such that the address can arrive before the mid-point of the read cycle, at which point the sense amplifiers allow the read data to flow through quickly leaving more than a third of the cycle for post-RAM combinatorial delays. In cases where the majority of the delay is prior to the RAM, the sense amplifiers remain active during the second half so that the address can arrive towards the end of the cycle and the correct data is still read out of the RAM. It can be seen, therefore, that nearly the full range of flexibility of a fully asynchronous RAM macro is preserved.

However, the current/power requirements are reduced by half, since the sense amplifiers are not enabled during the first half of the cycle. For writes, the write enable is active the entire cycle so that the sense amplifiers are never activated. This is an improvement over conventional asynchronous RAM macros in which a "false" read is started at the beginning of the cycle (during the period when the combinatorial logic is creating and setting up the write address lines) before the write strobe can be activated indicating a write cycle. By avoiding a "false" read during the first half of the write, the current requirement during the write is reduced by more than 50% (since the sense amplifiers operating during the first half of the write overwhelmed the actual current needs of a write).

Thus, the present invention includes an asynchronous memory circuit including one or more sense amplifiers and a clock circuit, which may be configured to generate a clock signal. For example, the clock signal may be generated by a counter followed by a flip-flop. Alternatively, the clock signal may be generated by any other circuit element, or combination of circuit elements, capable of generating a cyclical signal. The one or more sense amplifiers may be configured to operate in response to the clock signal and a control signal, such that the control signal may indicate the occurrence of either a read or write cycle. The asynchronous memory circuit may further include a combinatorial logic circuit, which may combine the clock signal and control signal to produce a read enable signal. In addition, the one or more sense amplifiers may receive the read enable signal from the combinatorial logic circuit, such that the read enable signal may activate the one or more sense amplifiers only during a portion of a read cycle.

The present invention also includes a method for reducing the power consumption in an asynchronous memory circuit. Such a method may include activating one or more sense amplifiers only during a second half of a read cycle, and deactivating one or more sense amplifiers during an entire write cycle. In this manner, the method may disable the sense amplifiers for substantially half the amount of time needed in conventional asynchronous memory circuits.

Furthermore, the present invention may include a sense amplifier configured to detect a voltage difference on a bit line of a memory array only during a select portion of a clock signal. The sense amplifier may include at least one transistor coupled between a differential amplifier and a power supply or ground connection. The transistor may be adapted to receive a read enable signal, such that the read enable signal may activate the sense amplifier only during the select portion of the clock signal.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

A memory device, system architecture and method are provided herein. The system architecture and method is used for clocking a memory device, such as an asynchronous RAM, to minimize power consumed by the memory device. A clock is added to the memory device (e.g., RAM, or asynchronous RAM) that allows the RAM internal logic to precisely gate the clock for write transactions as well as read transactions. For writes, a write enable may be active during the entire clock cycle so that the sense amplifiers are generally not activated. For read transactions, the clock may be used to enable the sense amplifiers only during a second half of the clock cycle. Reduced "on" time for the sense amplifiers generally results in reduced power consumption.

Figure 4:
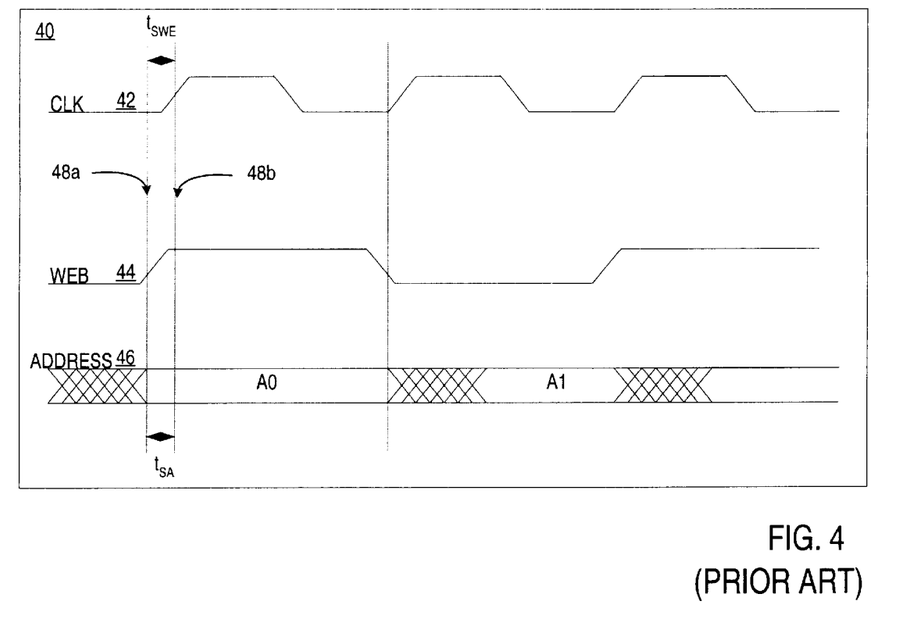
FIG. 4 illustrates the stringent setup time requirements of a synchronous RAM device.

While synchronous RAM devices generally minimize power consumption, synchronous RAM devices must do so at the expense of a very short access window. In other words, the full address access time must be met at the time of the rising clock edge. This requires fairly precise alignment of the clock rising edge as shown in FIG. 4. Associated with synchronous RAM devices are fairly stringent setup time requirements. However, the depth and timing delays of the combinatorial address path and combinatorial data path can vary. This can increase the precision needed between the rising edge of the clock and the timing of the address signals, or the time needed to allow the sense amplifiers to access the to-be read data.

Although conventional asynchronous RAM devices are not dependent upon combinatorial logic needed to create a precisely-aligned clock rising edge, the sense amplifiers within a conventional asynchronous RAM will consume significant amounts of power. Compared to conventional asynchronous RAM cells and conventional synchronous RAM cells, the RAM presented herein allows for variations in combinatorial address path and combinatorial data depth without the need for precise alignment of the clock rising edge (a detriment of existing synchronous RAM devices). Moreover, the RAM described herein significantly decreases power consumption during both read and write cycles (an improvement over existing asynchronous RAM devices).

Figure 1:
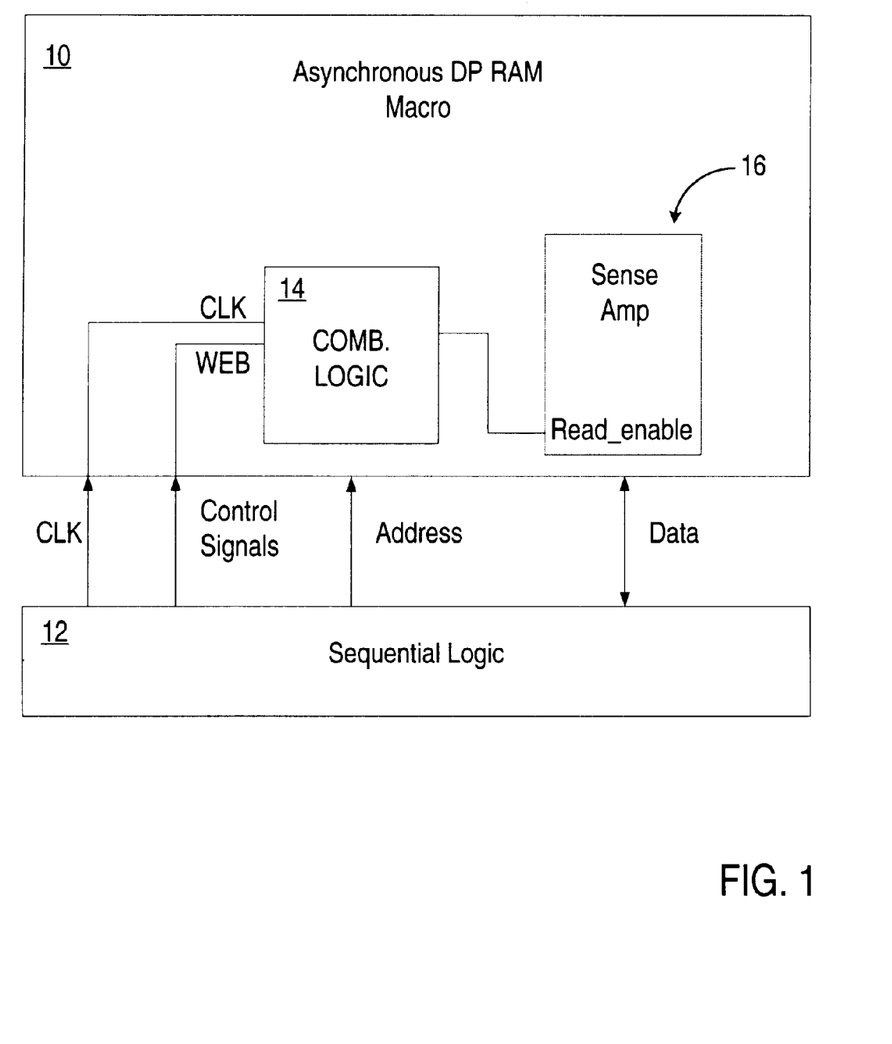
FIG. 1 illustrates the general operation of the clocked asynchronous RAM device.

Turning to the drawings, FIG. 1 illustrates the general operation of a clocked asynchronous RAM device. Among other internal structures, such as a memory array and row/column decoders, asynchronous RAM cell ("macro") 10 may include one or more sense amplifiers 16 and combinatorial logic circuit 14. Asynchronous RAM macro 10 may also be coupled to a sequential logic circuit 12, such that sequential logic circuit 12 may communicate (i.e. transmit/receive signals) with asynchronous RAM macro 10. In this manner, sequential logic 12 may transmit an address to asynchronous RAM macro 10, such that the address may indicate the location of the data to be read from the memory cell. Once the address is decoded and the data accessed from memory, the data may be transmitted back to sequential logic 12 in the case that sense amplifier 16 is activated, thereby indicating that a read from memory may occur (i.e. during a portion of a read cycle).

Sequential logic 12 may include a clock circuit configured to generate a clock signal (CLK). The clock signal may be generated by a counter followed by a flip-flop, or alternatively, by any other combination of circuit elements needed to produce a cyclical signal. Sequential logic 12 may also transmit the clock signal, along with one or more control signals (e.g. WEB), to combinatorial logic circuit 14 within asynchronous RAM macro 10. Combinatorial logic circuit 14 may, therefore, combine the clock signal and control signals in such a manner as to produce a read enable output signal. Thus, the read enable signal may activate sense amplifier 16 during the portion of the clock signal in which a read may be allowed to occur.

Figure 2:
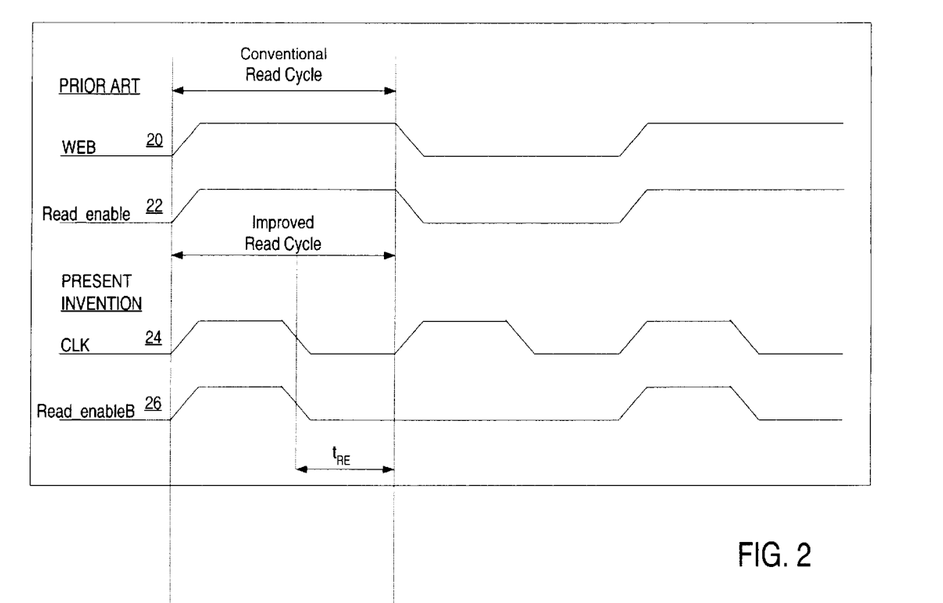
FIG. 2 describes the waveforms and illustrates the power improvements of the improved read cycle of a clocked asynchronous RAM compared to a conventional asynchronous RAM read cycle.

FIG. 2 is a waveform description comparing a conventional asynchronous RAM read cycle with the improved read cycle of a clock enhanced, asynchronous RAM. In the case of a conventional read cycle, a logic level high control signal, or WEB (i.e. write enable bar) signal 20, may indicate the occurrence of a read cycle. In such a case, Read_enable signal 22 may power the sense amplifier during the entire read cycle, causing the high current sense amplifiers to be active for a long period of time.

On the other hand, the improved read cycle of the clocked asynchronous RAM may power the sense amplifier only during a portion of the read cycle. In particular, the read cycle may correspond to the clocking signal (CLK) 24, to produce a read enable signal according to the combinatorial logic of FIG. 1. The read enable signal will allow the sense amplifiers to be active only during the times when the clocking signal is low; thus, the complemented read enable signal 26 is low arising from the output of the combinatorial logic placed within the asynchronous RAM, shown in FIG. 1. In this manner, the combinatorial logic may produce a read enable signal during a portion of the clock cycle, such that the sense amplifiers may be powered only during the second half of the read cycle. In FIG. 2, for example, complemented read enable signal 26 may transition to low concurrently with the transition of CLK 24 to low, such that complemented read enable signal 26 may activate the sense amplifiers only during time $t_{RE}$. This may disable the sense amplifiers for substantially half the amount of time needed in conventional asynchronous memory read cycles.

Figure 3:
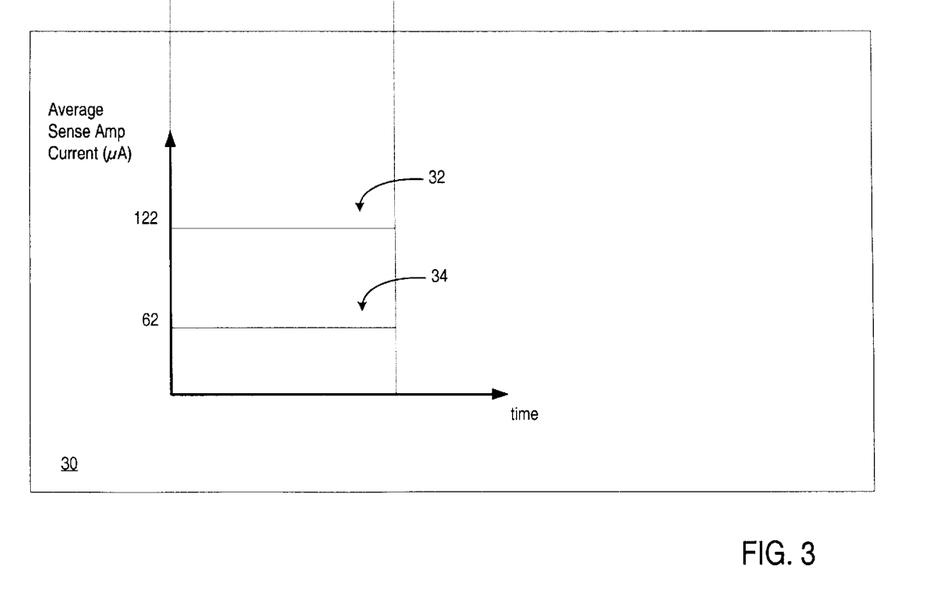
FIG. 3 illustrates the current savings of a clocked asynchronous RAM device compared to a conventional asynchronous RAM device.

FIG. 3 illustrates the current savings of a clock enhanced, asynchronous RAM read cycle compared to a read cycle of a conventional asynchronous RAM device. In order to demonstrate the improvement of the clock enhanced asynchronous RAM, FIG. 3 compares the average sense amplifier current ($\mu$A) consumed over time for each memory device. FIG. 3 shows that the average current consumed as a result of clock enhancement (line 34) may be substantially half the amount of the average current consumed during a conventional asynchronous read cycle (line 32). As such, the current/power improvement of the clock enhanced, asynchronous RAM may be directly related to the amount of time the sense amplifiers are activated compared to a conventional asynchronous RAM device.

As stated above, a conventional asynchronous RAM device may power the sense amplifiers during an entire read cycle, while the clocked asynchronous RAM may power the sense amplifiers only during a portion of the read cycle. In addition to reads, power improvements may also be illustrated during write cycles of the clocked asynchronous RAM. Specifically, the write enable signal (WEB) of the clocked asynchronous RAM may be active (i.e. logic level low) during the entire write cycle, such that sense amplifiers are deactivated, or switched off, during an entire write cycle. This improves on conventional asynchronous RAM devices in which a "false" read may be created at the beginning of a new clock cycle. The cycle may be initialized as a "false" read cycle during the period when the combinatorial logic is setting up the write address lines, and before the write enable signal may be activated to indicate a write cycle. By avoiding a "false" read during the first half of a write cycle, the current requirement during the write cycle may be reduced by more than 50%, since the sense amplifiers operating during the first half of the write cycle may draw more power than the actual needs of the write cycle.

Though a conventional synchronous RAM may require less power than a conventional asynchronous RAM, the disadvantage of the synchronous RAM lies in the strict time constraints placed upon the device to setup either a read or write cycle. FIG. 4 illustrates the timing constraints of a conventional synchronous RAM read cycle 40. A control signal (i.e. WEB 44) may be used to indicate the occurrence of a read cycle upon transitioning to logic level high (48$a$). However, the clock signal (i.e. CLK 42) may enable the read to occur once CLK 42 transitions to logic level high (48$b$), a short time thereafter. In this manner, the next address (address A0) on the address line 46 must be setup during the time after a read is indicated, but before the read is enabled. Thus, a conventional synchronous RAM may provide a very short access window, $t_{SA}$, in which the address must arrive and be decoded prior to the rising edge of the clock. Similarly, the time needed to setup the write address lines during a write cycle, $t_{SWE}$, may be confined to the same short access window.

Such a setup may be difficult in most synthesized logic integrated circuits where there is a moderate amount of combinatorial logic both in the address path prior to the RAM and in the data path after the RAM. In the case of a conventional synchronous RAM, the rising edge of the clock must be precisely aligned to occur at a time after the address has arrived and been decoded, but early enough to allow the sense amplifier to access and transmit the data through the logic in the data path arranged after the RAM. Although it may be theoretically possible to make such an alignment, it is exceedingly difficult to match the alignment of the clock rising edge with the arrival of the address. In addition, the address delay may carry as it flows through many levels of logic, and may be influenced by a combination of gate delays and routing delays. A problem, therefore, may occur since the precise nature of the delays may vary considerably over the wide range of fabrication processes.

Figure 5:
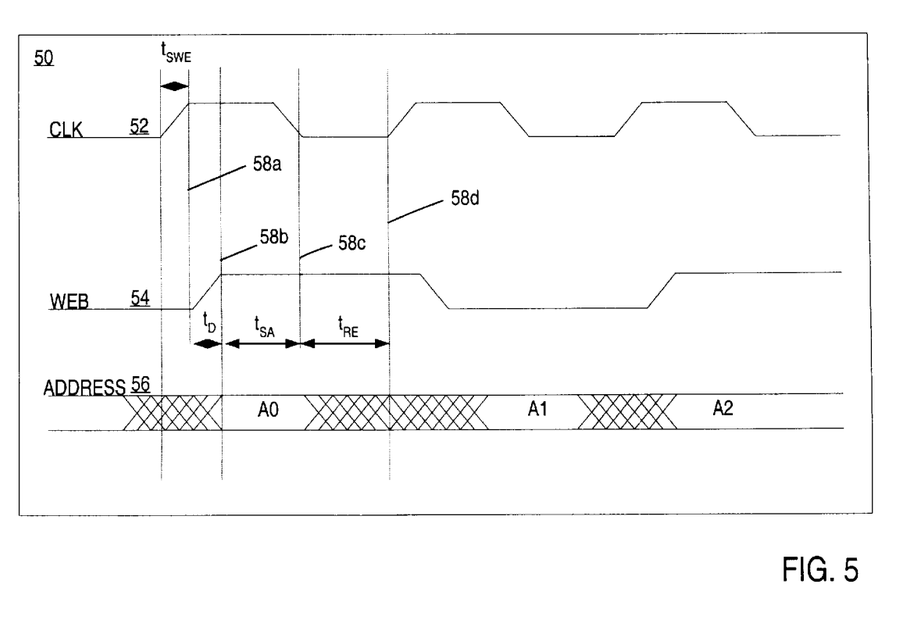
FIG. 5 illustrates the more relaxed set-up time requirements of a clock enhanced asynchronous RAM.

To overcome the problems associated with conventional RAM devices, it may be desirable to create a clock enhanced asynchronous RAM combining the substantially relaxed time requirements of an asynchronous RAM with the reduced power consumption and clock management of a synchronous RAM. FIG. 5 is a timing diagram illustrating clock enhanced asynchronous RAM read cycle 50. As stated above, address decoding may occur during the first half of the clock cycle, or when CLK 52 becomes logic level high (58$a$). Similar to the synchronous RAM in FIG. 4, a control signal (i.e. write enable bar, or WEB 54) may indicate the occurrence of a read cycle by transitioning to logic level high (58$b$). Such a transition may be delayed by time, $t_D$, to account for additional logic that may be placed in the address path prior to the RAM, or in the data path after the RAM. In this manner, a time relationship ($t_D$) may exist between the transitioning of the clock signal (58$a$) and the transitioning of the control signal (58$b$), where the time relationship may vary substantially in accordance with the time needed to implement an addressing operation.

However, unlike a synchronous RAM, clock signal (CLK) 52 may enable a read transaction only during a second half of the clock signal, or when CLK 52 transitions to logic level low (58$c$). As such, the next address (address A0) on address line 56 may be setup during a time, $t_{SA}$, which may substantially equal the first half of the read cycle. Once address A0 has arrived and been decoded, a read enable signal may then activate the sense amplifiers during the time remaining in the read cycle. As shown in FIG. 5, the read enable signal may activate the sense amplifiers during a time when CLK 52 is low (58$c$–58$d$), such that the sense amplifiers may remain active during the second half of the read cycle (i.e. during time $t_{RE}$).

Therefore, the clock enhanced asynchronous RAM may allow address decoding to occur during the first half of the clock cycle, while the sense amplifiers may be enabled during the second half of the clock cycle. The flexibility of a longer read access window may allow the address to arrive at any time prior to the mid-point of the read cycle, such that the sense amplifiers may quickly transmit the read data, possibly leaving more than a third of the cycle for post-RAM combinatorial delays. In the cases in which the majority of the delay is prior to the RAM, the sense amplifiers remain active during the second half of the cycle, such that the address may arrive towards the end of the cycle without risking reading incorrect data out of the RAM. Thus, the clock enhanced asynchronous RAM may preserve nearly the full range of flexibility of a conventional asynchronous RAM.

Figure 6A:
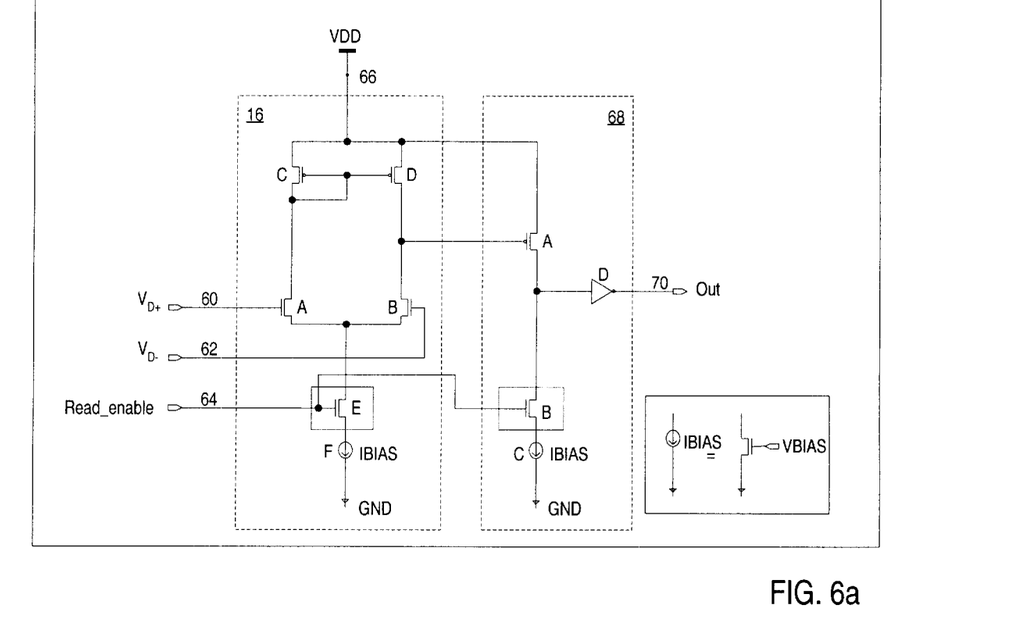
FIG. 6A illustrates incorporating a read control cut-off circuit into a sense amplifier that is coupled to a bit line of a memory array.
Figure 6B:
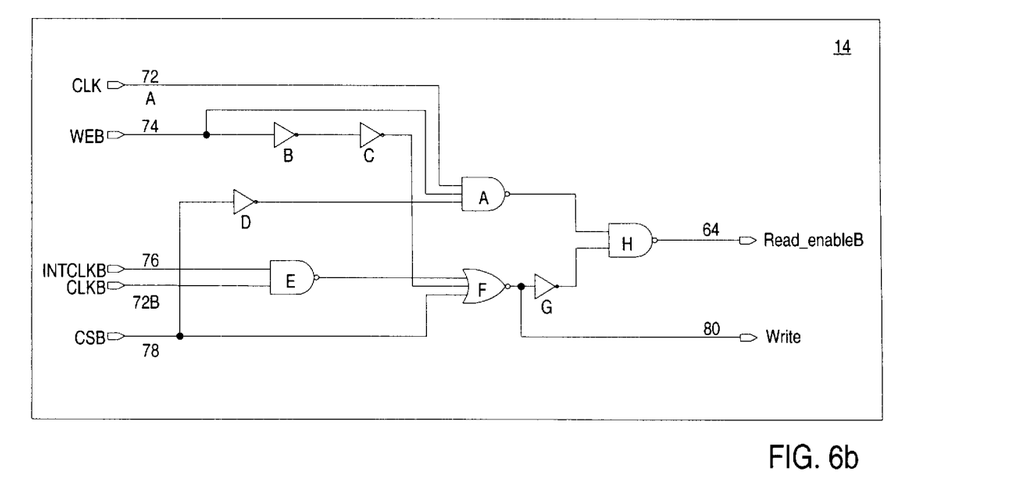
FIG. 6B illustrates a read enable signal generator circuit, i.e. combinatorial logic circuit, coupled to the read control cut-off circuit.

FIGS. 6A and 6B illustrate circuit elements of the clock enhanced asynchronous RAM of the present invention. FIG. 6A is a circuit diagram of sense amplifier 16, as shown in FIG. 1, including the incorporation of a read control cut-off circuit (16E). Sense amplifier 16 may be connected to a bit line (60) of the memory array, such that the bit line may be coupled to substantially all of the memory cells within a single column of the memory array. As such, the data specified by the current address may be accessed from the memory array and placed on bit line 60 as voltage signal $V_{D+}$. Sense amplifier 16 may determine whether or not data has been read from the memory array by comparing voltage signal $V_{D+}$ on bit line 60 with a reference voltage ($V_{D-}$) coupled to line 62. As such, sense amplifier 16 may be a differential amplifier, which may include two or more transistors coupled between bit line 60 and reference line 62. In this manner, sense amplifier 16 may be configured to sense a voltage difference between bit-line 60 and reference line 62, thereby, indicating that data has been accessed from the memory array.

Sense amplifier 16 may also include a read control cut-off circuit. Such a circuit may include at least one transistor (16E) coupled between a differential amplifier (16A, B, C, D) and a ground connection (GND). Alternatively, transistor 16E may be coupled between the differential amplifier and a power supply (VDD 66). In any configuration, transistor 16E may be adapted to receive a read enable output signal (Read_enable 64) from combinatorial logic circuit 14 of FIG. 6B. However, the output signal of circuit 14 may be the logic complement equivalent of the input signal received by sense amplifier 16. For example, the output signal of circuit 14 may encounter a NOT gate (i.e. logic complement gate) prior to arriving at transistor 16E. In an alternative example, transistor 16E may be a p-channel MOSFET instead of an n-channel MOSFET, such that the input to sense amplifier 16 may be substantially equivalent to the output from combinatorial logic circuit 14. In such an example, the power supply (VDD,66) and ground (GND) connections to sense amplifier 16 may also be reversed, such that the power supply may be coupled to transistor 16E and the ground connection may be coupled to the differential amplifier. Transistor 16E may be further adapted to activate sense amplifier 16 only during a select portion of a clock signal (e.g. when CLK 72A is low).

In addition, sense amplifier 16 may be coupled to buffer circuit 68, as shown in FIG. 6A. Buffer circuit 68 may be adapted to drive the output from the differential amplifier (i.e., Out 70) to a load, where the load may be any circuit element configured to receive the output. Buffer circuit 68 may also include a read control cut-off circuit, including at least one transistor (68B). In this manner, activation of Read_enable signal 64 (i.e. when Read_enable 64 is high) may allow the output signal (Out 70) to drive the load with a logic level high voltage signal.

FIG. 6B is a circuit diagram describing the internal logic of the clock enhanced asynchronous RAM that may allow precise gating of the clock during write cycles as well as read cycles. In other words, FIG. 6B illustrates exemplary components within combinatorial logic 14 of FIG. 1. For both reads and writes, the clock (CLK 72A) may be used to enable a read or write transaction during a second half of the read or write cycle (when the clock is low). A separate write enable signal (WEB) may be used to distinguish between a read and write during a first half of the cycle (when the clock is high). In addition, a standard chip select. (CSB) may be used to enable the function of the RAM.

The internal logic, or combinatorial logic circuit 14, may include input signals 72A, 72B, 74, 76, and 78 along with a plurality of logic elements 16 A–H. As stated above, combinatorial logic circuit 14 may combine a clock signal (CLK 72A) with a control signal (WEB 74) to produce a read enable output signal (Read_enableB 64). For example, WEB 74 may indicate the occurrence of a read cycle, while CLK 72A may enable a read to occur during a second half of the read cycle. As such, combinatorial logic circuit 14 may be configured to produce a logic level high Read_enable signal (or logic level low Read_enableB) when CLK 72A is low and WEB 74 is high. Alternatively, WEB 74 may indicate the occurrence of a write cycle, while CLK 72A may enable a write to occur during a second half of the write cycle. In such an example, combinatorial logic circuit 14 may be configured to produce a logic level low Read_enable signal (or logic level high Read_enableB) when both CLK 72A and WEB 74 signals are low.

Furthermore, a method for reducing the power consumption in an asynchronous memory circuit may also be contemplated herein. Such a method may include activating (i.e. switching on) one or more sense amplifiers only during a second half of a read cycle, and deactivating (i.e. switching off) one or more sense amplifiers during an entire write cycle. The method may also include generating a signal to indicate the occurrence of either a read cycle or a write cycle. For example, the signal may be a write enable bar (WEB) signal, or the logic complement thereof, such that a read cycle may be indicated when WEB is high. Conversely, a write cycle may be indicated when WEB is low.

In addition, the method may include generating a clock signal to enable a read or write transaction only during a select portion of the read or write cycle. As stated above, address decoding may occur during the first half of a clock cycle, such that a read or write transaction may occur (i.e. by enabling the sense amplifiers) during the second half of the clock cycle. Thus, the select portion of the read/write cycle may occur during the second half of the clock cycle.

The method may further include generating a read enable signal (i.e. Read_enable 64) to initiate a read transaction. Such a read enable signal may be configured to activate the one or more sense amplifiers during the second half of the read cycle, in a manner as illustrated in FIG. 6A. For example, Read_enable 64 may be logic level high to indicate that a read from memory may occur. During such time, Read_enable 64 may activate transistor 16E, which in turn may enable differential amplifier 16A, B, C, D. Differential amplifier 16A, B, C, D may sense a voltage differential between the bit line ($V_{D+}$ 60) and a reference line ($V_{D-}$ 62). Such a voltage differential may indicate that the desired data has been read from memory and placed on the corresponding bit line.

The method may also include generating a signal to indicate the occurrence of a write. As stated above, the signal may be a write enable bar (WEB) signal, or the logic complement thereof, such that a write cycle may be indicated when WEB is logic level low. Indicating a write cycle with a low WEB signal may, therefore, cause the internal logic elements of combinatorial logic circuit 14 of FIG. 6B to transmit a low read enable signal (i.e. Read_enableB is high) to sense amplifier 16 of FIG. 6A. As such, a low WEB signal may produce a low read enable input signal, such that the read enable signal may also be configured to deactivate, or switch off, the one or more sense amplifiers during the entire write cycle. In this manner, the method may disable the sense amplifiers for substantially half the amount of time needed in conventional asynchronous memory circuits.

In an alternative embodiment, a system and method may also be contemplated in which the gating of the clock during read and write cycles is substantially reversed. For instance, the clock may be used to enable a write transaction during the first half of the clock cycle (when the clock is high). Similarly, the clock may be used to enable the sense amplifiers only during the first half of the clock cycle for read transactions (also when the clock is high). In addition, a separate write-enable signal (WE) may be used to distinguish between a read and write during the second half of the clock cycle (when the clock is low). Such an embodiment may be desirable in cases where a majority of external logic may be arranged after the RAM instead of sandwiched around the RAM. As such, completing a read or write transaction during the first half of a clock cycle may allow additional time for post-RAM combinatorial delays.

Thus, compared with conventional memory devices, the present device utilizes a clock used in a combinatorial logic, which is fed to the RAM cell, and the write enable clock is changed to be the full width of the clock period. The combinatorial logic is simplified and timing analysis is also simplified leading to improved designs with reduced operating current.

Compared to conventional asynchronous RAM devices, current is greatly reduced during both read and write cycles, and no combinatorial logic is needed on the clock lines to create a write strobe. Moreover, compared to conventional asynchronous RAM macros, precise alignment of the clock rising edge is eliminated, and the depth of the combinatorial address path and combinatorial data can be varied. A latch can be added at the output stage in order to increase the data hold time of a read (since the sense amplifiers are normally turned off as soon as the clock rises, there could be a need to increased hold time outside of the RAM macro). Another alternative is to implement a PLL within the RAM macro in order to increase the granularity available and create additional time slices within which the internal memory access (read) or memory write (strobe) occurs. For example, a 2× PLL would allow the selection of the 2nd, 3rd, or 4th quarter of the cycle to perform the internal read or write, resulting in reduced current consumption at the expense of additional complexity—PLL, need to more precise control over the external combinatorial delays.

New features of the present disclosure include combining a clock with an asynchronous RAM to create an asynchronous RAM that works within a subset of a full clock period, but allows the address access and other internal RAM functions to occur throughout the clock period. Use of the present method simplifies the timing analysis of the logic path through the RAM, increases the clock frequency of the resulting logic (compared to a synchronous RAM with narrow timing window), reduces the current requirements (compared to asynchronous RAM), and allows the combinatorial logic to be changed late in the design cycle without the need for a RAM redesign. As more and more logic is synthesized and internal RAM is used to put increasing function on the same die, it is desirable to invent new RAM that efficiently trades-off the capabilities of logic and provides a structures which meshes well with synchronous synthesized logic design methodologies, while at the same time recognizing the need to be as stingy as possible with operating current.

It will be appreciated to those skilled in the art having the benefit of this disclosure that this invention is believed to provide a system and method in which a clock may be incorporated into an asynchronous RAM cell, thereby combining the speed and flexibility of conventional asynchronous RAM cells, with the reduced power consumption of synchronous RAM cells. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. An asynchronous memory circuit, comprising:
   one or more sense amplifiers configured to operate in response to a control signal and a clock signal;
   a clock circuit configured to generate the clock signal; and
   a combinatorial logic circuit configured to combine the clock signal and the control signal to produce a read enable signal configured to:
   switch off the one or more sense amplifiers during an entire cycle of the clock signal when a write cycle is indicated by the control signal; and
   switch on the one or more sense amplifiers for a duration corresponding to one half of the clock cycle when a read cycle is indicated by the control signal.

2. The asynchronous memory circuit as recited in claim 1, wherein the read enable signal is configured to switch on the one or more sense amplifiers during a second half of the read cycle, and to switch off the one or more sense amplifiers during an entire write cycle.

3. The asynchronous memory circuit as recited in claim 1, wherein the clock signal is configured to enable a read transaction during a second half of the clock cycle.

4. The asynchronous memory circuit as recited in claim 1, wherein by combining the clock signal and the control signal, the combinatorial logic circuit is configured to produce a logic level high read enable signal during a second half of the clock cycle, and a logic level low read enable signal during the entire clock cycle.

5. The asynchronous memory circuit as recited in claim 1, wherein a time relationship between a transition of the control signal and a transition of the clock signal substantially varies corresponding to time needed for implementing an addressing operation.

6. The asynchronous memory circuit as recited in claim 1, further comprising a latching device coupled to an output stage of the memory circuit, wherein the latching device is configured to hold data read during the read cycle for an amount of time beyond the end of the read cycle.

7. The asynchronous memory circuit as recited in claim 1, wherein the clock signal is configured to enable a read transaction during a first half of the clock cycle, and wherein the read enable signal is configured to switch on the one or more sense amplifiers during a first half of the read cycle.

8. A method for reducing power consumption in an asynchronous memory circuit, comprising:
   receiving a control signal indicating whether a read cycle or a write cycle is to occur during a cycle of a clock signal;
   if the write cycle is to occur, switching off one or more sense amplifiers during an entire duration of the cycle; and if the read cycle is to occur, switching off the one or more sense amplifiers upon receiving a first transition of the clock signal, and switching on the one or more sense amplifiers upon receiving a next transition of the clock signal.

9. The method according to claim 8, further comprising generating the clock signal to enable a read transaction or a write transaction only during a select portion of the read cycle or the write cycle, respectively.

10. The method according to claim 8, further comprising decoding a memory address during a first half of the read cycle when the one or more sense amplifiers are switched off.

11. The method according to claim 10, further comprising generating a read enable signal configured to switch on the one or more sense amplifiers during a second half of the read cycle.

12. The method according to claim 11, wherein the control signal comprises a write enable signal configured to switch off the one or more sense amplifiers during an entire write cycle.

13. The method according to claim 8, further comprising disabling the one or more sense amplifiers for substantially half the amount of time needed in conventional asynchronous memory circuits.

14. The method according to claim 8, further comprising generating a read enable signal configured to switch on the one or more sense amplifiers during a first half of the read cycle, and configured to switch off the one or more sense amplifiers during an entire write cycle.

15. A sense amplifier coupled to an asynchronous memory circuit, wherein the sense amplifier comprises at least one transistor coupled between a differential amplifier and a power supply or ground, and wherein the transistor is adapted to receive a read enable signal for:
  enabling the sense amplifier to sense a voltage difference on a bit line during only one half of a read cycle, wherein the one half extends between a first transition and a next transition of a clock signal; and
  disabling the sense amplifier during an entire write cycle corresponding to one cycle of the clock signal.

16. The sense amplifier as recited in claim 15, wherein the transistor is configured to activate the sense amplifier only during the period of time, and wherein the period of time comprises the time during which the clock signal and the read enable signal are logic level low.

17. The sense amplifier as recited in claim 15, wherein the differential amplifier comprises two or more transistors coupled between the bit line and a reference voltage, and wherein the differential amplifier is configured to sense the voltage difference between the bit line and the reference voltage.

18. The sense amplifier as recited in claim 15, wherein the sense amplifier is coupled to a buffer circuit adapted to drive an output from the differential amplifier to a load.

19. The asynchronous memory circuit as recited in claim 1, wherein the one half of the clock cycle extends between a first transition and a next transition of the clock signal and comprises a logic low value.

20. The method according to claim 8, wherein a duration between the first transition and the next transition comprises a logic low value.

* * * * *